United States Patent [19]

Woolley, Jr. et al.

[11] 4,115,919
[45] Sep. 26, 1978

[54] MACHINE FOR PRESS FIT INSERTION OF CHIP DEVICES

[75] Inventors: Harold Oakley Woolley, Jr., Hershey; Charles Richard Wise, Jr., Annville, both of Pa.

[73] Assignee: AMP Incorporated, Harrisburg, Pa.

[21] Appl. No.: 844,854

[22] Filed: Oct. 25, 1977

[51] Int. Cl.² .............................................. H05K 3/32
[52] U.S. Cl. ...................................... 29/740; 29/626; 29/759
[58] Field of Search ................ 29/740, 759, 626, 569, 29/739, 741

[56] References Cited

U.S. PATENT DOCUMENTS

| | | | |
|---|---|---|---|
| 3,893,232 | 7/1975 | Fletcher | 29/626 |
| 4,064,552 | 12/1977 | Angelucci et al. | 29/626 X |

*Primary Examiner*—Carl E. Hall
*Attorney, Agent, or Firm*—Gerald K. Kita

[57] ABSTRACT

The disclosure relates to a machine for inserting one or a plurality of small low voltage conducting chips in the form of LED's or other circuit elements within apertures of planar circuit paths. A series of chips are serially arranged along a grooved path and are intermittently fed along the path by a sweep toward an insertion station where a pressure platen firmly holds a flexible circuit in a position to receive the chips. A manually rotatable crank operates a cam driven ram which urges a foremost chip into press fit relationship within an aperture of the flexible circuit. The cam also operates the sweep intermittently advancing the same to position an additional chip at the work station.

2 Claims, 6 Drawing Figures

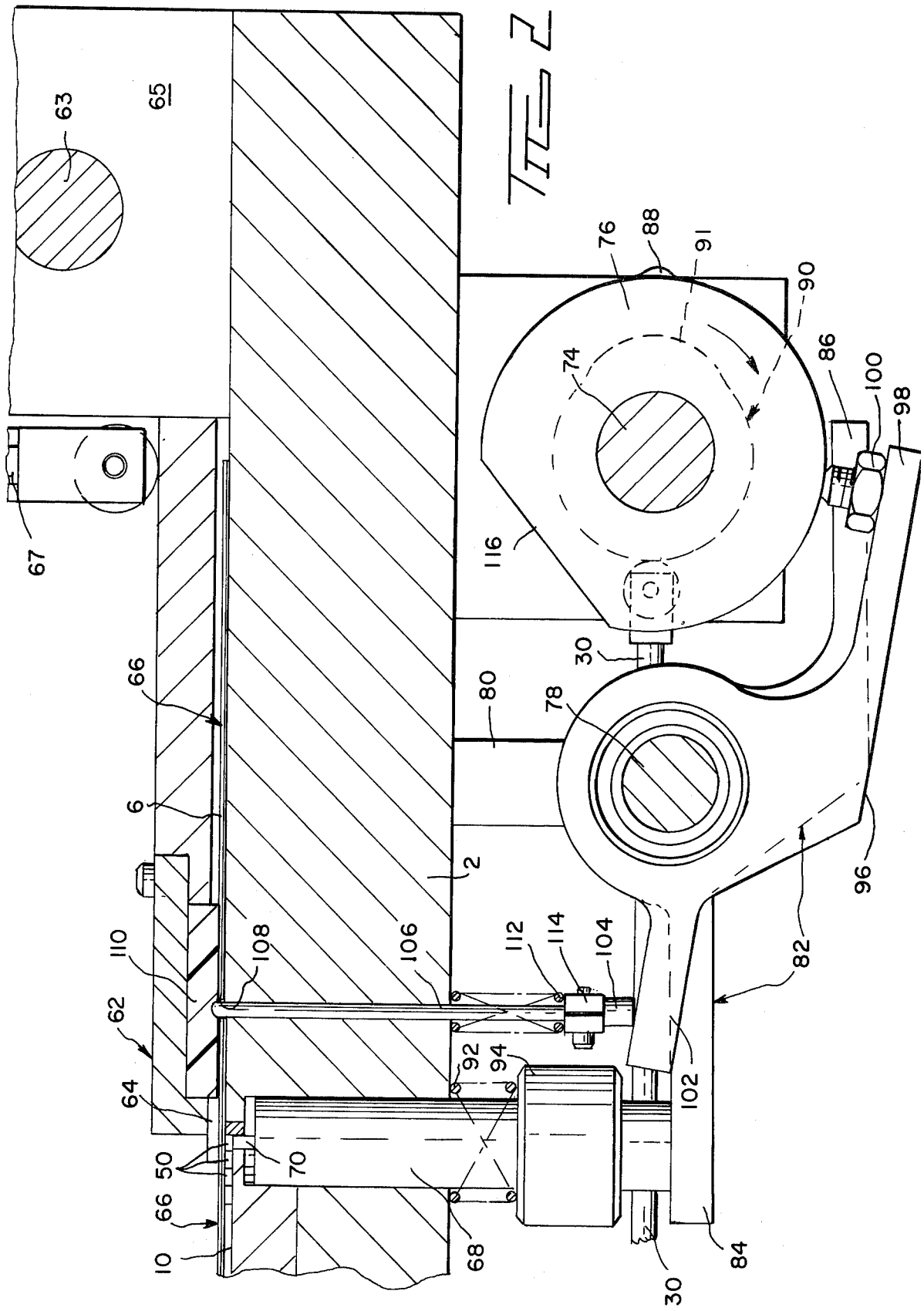

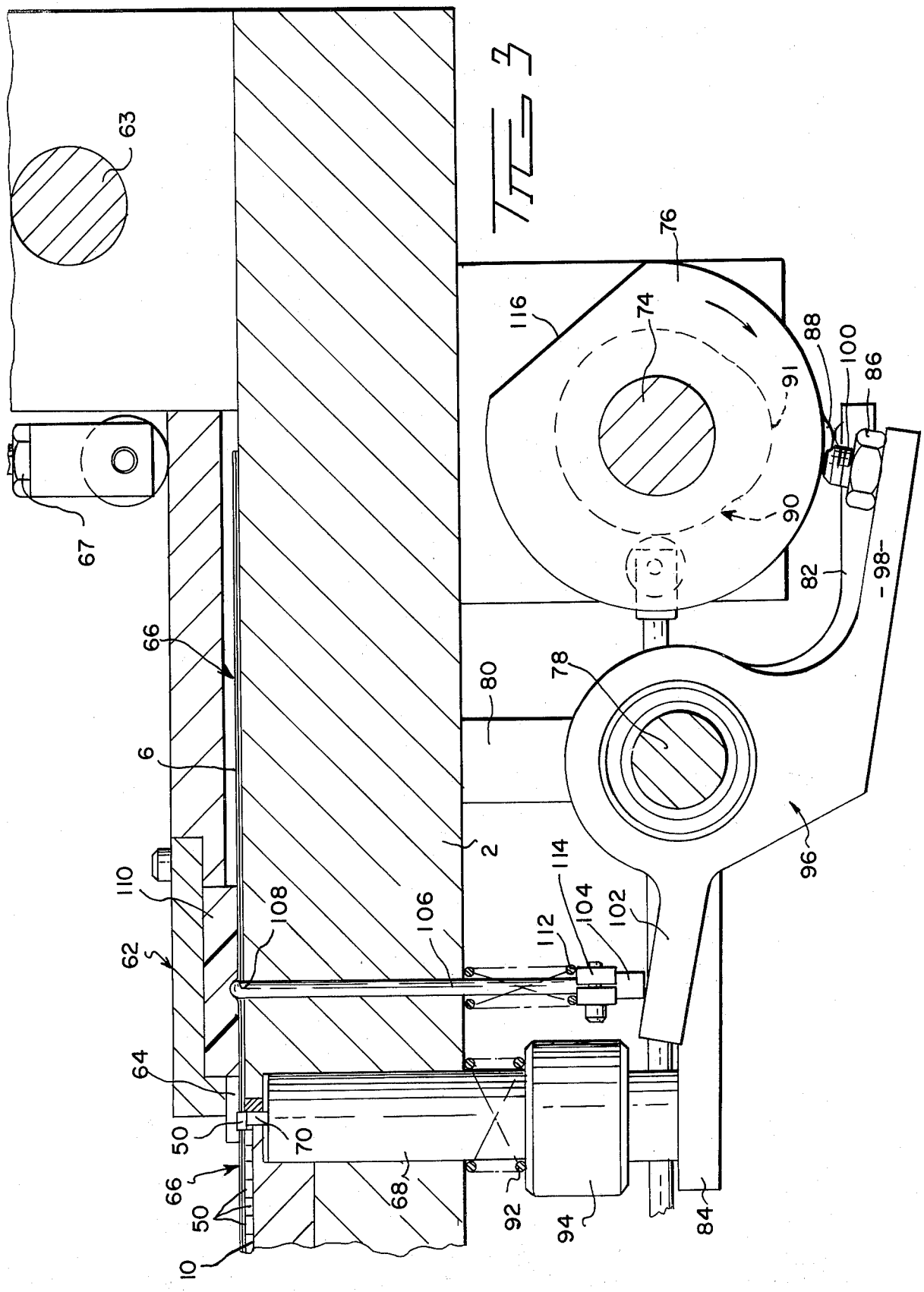

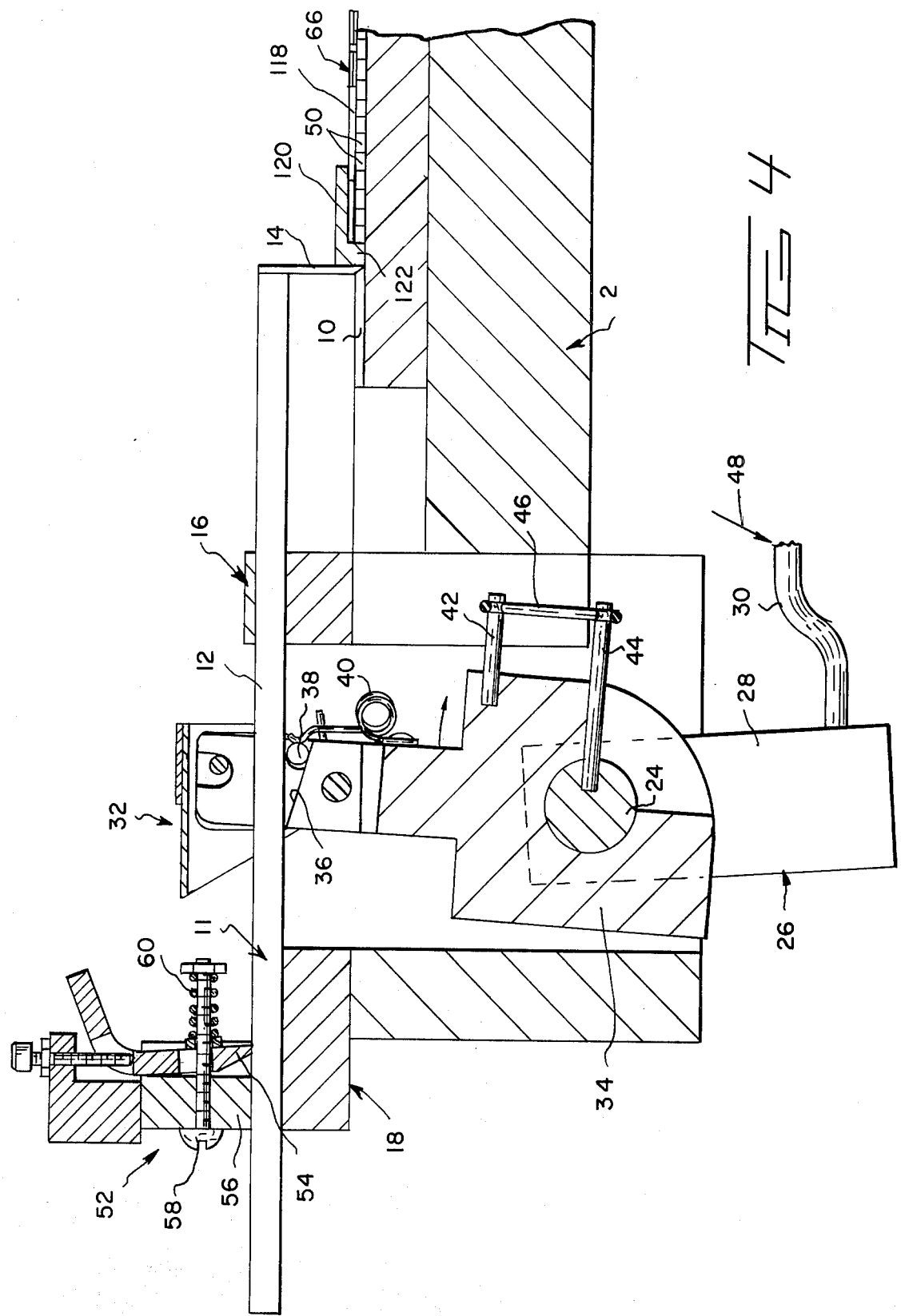

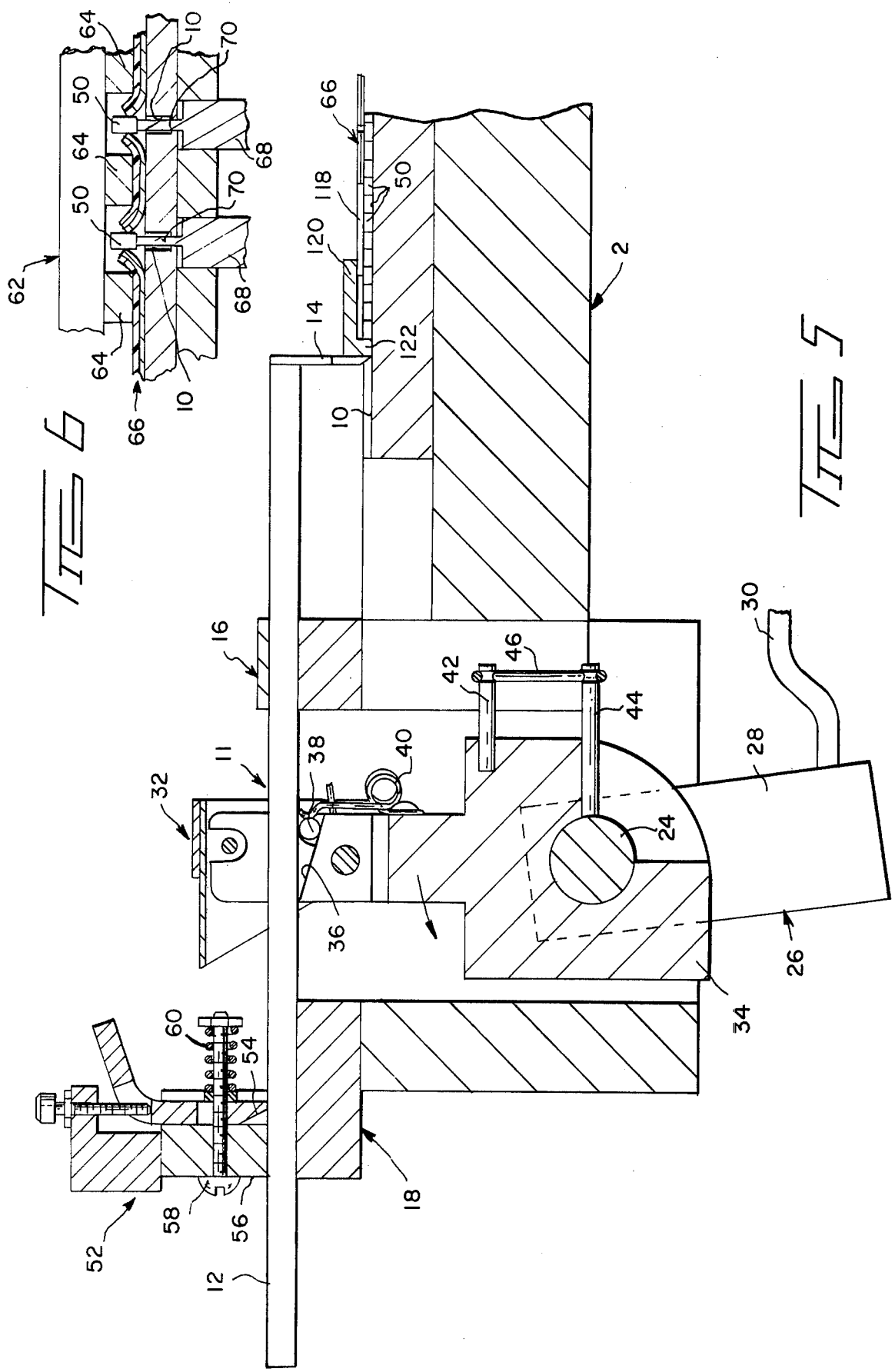

MACHINE FOR PRESS FIT INSERTION OF CHIP DEVICES

FIELD OF THE INVENTION

The present invention relates to insertion of small electronic components, and more particularly, to a machine for serially advancing an array of LED chips to a work station and for inserting the chips in press fit relationship within a device having coplanar circuits, such as a device known as a flexible circuit.

BACKGROUND OF THE PRIOR ART

Small electronic chips such as LED's are desirably mounted on flat flexible circuits by press fitting the chips within corresponding openings in the circuitry according to the disclosure of U.S. Pat. No. 4,024,627. The circuitry at the edges of the openings are bowed outwardly by the presence of the chips. Mechanical friction between the chips and the bowed circuitry sufficiently maintains the chips in place while establishing satisfactory electrical contact between the chips and the circuitry. In such a manner the chips are press fitted within the apertures of the circuit device.

Due to the small size of the chips it is imperative that handling and insertion of the chips be accomplished by a semi-automatic machine, leaving delicate chip alignment and insertion operations to precision machinery, rather than human dexterity. Against this background of the prior art the present machine was developed.

BRIEF DESCRIPTION

In the invention, a work table is provided with one or more parallel grooves into which are serially arranged a plurality of small volume LED chips. The grooves communicate with a work station whereat a flexible flat circuit is positioned and maintained in position by a pressure platen overlying the circuit and pressing the same against a flat surface of the work station. Chip receiving openings in the flat circuit are positioned in alignment with corresponding grooves. A crank is manually actuated by an operator of the machine to rotate a cam, which in turn causes intermittent advancement of a sweep along the grooves, advancing a foremost LED chip along each of the corresponding grooves into registration or alignment with corresponding openings in the flexible circuit. Continued rotation of the cam actuates an insertion ram which forcefully urges each foremost chip into press fit relationship within a corresponding flexible circuit opening. Throughout the insertion operation the flexible circuit is held in place by latching pins. The latching pins are released by a cam follower in registration with a recessed flat bottom cam also actuated by the manual crank. The circuit is thereby released from the pins for repositioning by an operator.

OBJECTS

It is therefore an object of the present invention to provide a semi-automatic machine which indexes a serial array of electronic chips to a work station, together with cam actuated means for press fitting the chips into a circuit device and for intermittently actuating a sweep for indexing the serial array of chips.

Another object of the present invention is to provide a semi-automatic machine using cam actuation of an insertion ram for inserting and press fitting the foremost electronic chips into a circuit device and for intermittently indexing a serial array of chips in turn to a work station, the machine further including cam actuated circuit locating pins which automatically release the circuit device after a chip insertion operation.

Other objects and many attendent advantages of the invention will become apparent from the following detailed description taken in conjunction with the accompanying drawings.

DRAWINGS

FIGS. 2 and 3 are enlarged elevations in sections of the preferred embodiment illustrating a cam actuated insertion ram for urging a small electronic chip into press fit relationship within a flexible circuit device;

FIGS. 4 and 5 are fragmentary elevations in section illustrating the machine mechanism which causes intermittent indexing of a sweep which positions a serial array of chips, in turn, at a work station whereat an insertion ram is actuated to insert the chips into a circuit device;

FIG. 6 is a fragmentary front elevation in section of the preferred embodiment illustrating the position of the insertion ram of FIGS. 2 and 3 during insertion of chips into the circuit device.

DETAILED DESCRIPTION

Figure 1:
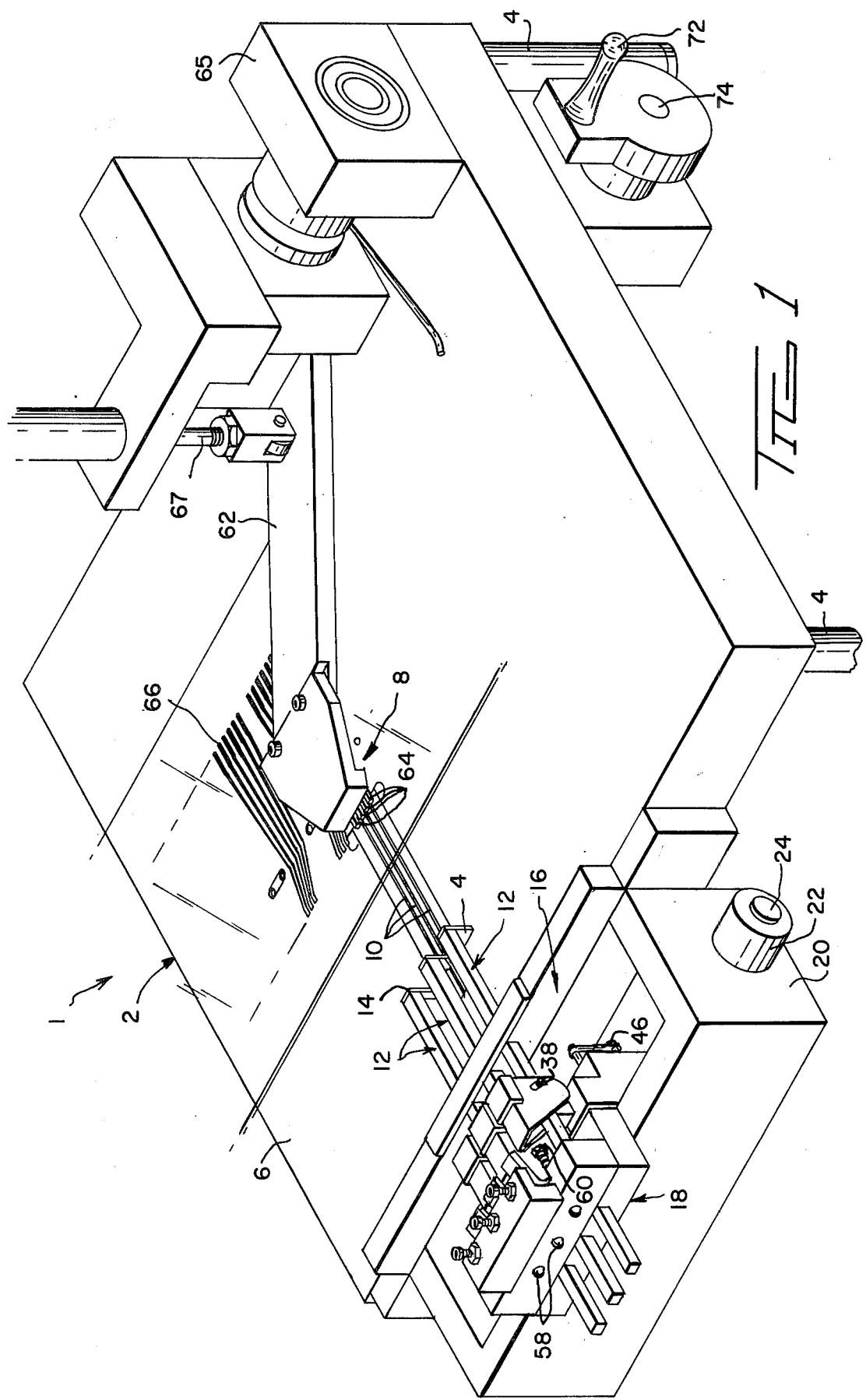
FIG. 1 is a fragmentary perspective of a machine according to the present invention.

As shown more particularly in FIG. 1 the machine for press fit insertion of chip devices is illustrated generally at 1 and includes a horizontal table 2 supported on legs 4. The table 2 includes a planar work surface 6 having a work station illustrated generally at 8. The surface 6 is provided with a plurality of parallel and vertically recessed grooves or paths 10 extending toward and communicating with a work station 8. Each path 10 is adapted to retain a serial array of chips. The paths may be of different cross sections to accept and receive therein chips of different graded sizes. A plurality of sweeps 11 have depending portions 14 in alignment with corresponding tracks 10. The sweeps are in the form of parallel elongated rods 12 of square cross-section in alignment with but elevated from the paths 10. The sweeps are slidably mounted within spaced apart sliding bearing blocks 16 and 18.

As shown in FIGS. 4 and 5, the bearing blocks 16 and 18 are mounted to a box-like enclosure 20 having bushings 22 which rotatably receive a shaft 24. A first pivot arm or crank arm 26 is fixedly secured at one end to the shaft 24 for rotation therewith. The pivot arm 26 includes a first vertically depending link 28 interconnected to a fixed generally horizontal link 30. Together the links 28 and 30 form the L-shaped pivot arm 26, the purpose of which will be described in detail. Rotatably received over the shaft 24 is a reciprocating releasable clevis or jam clamp 32. More particularly, the jam clamp includes an enlarged base portion 34 rotatably received over the shaft 24. The top end of the base 34 is provided with an inclined wedge surface 36 immediately underlying a corresponding rod or shaft 12. In the space between the surface 36 and a shaft 12 is provided a spherical or cylindrical rolling element 38. A keeper spring 40 mounted to the top of the base 34 engages and retains the element 38 in the space. The base 34 further includes a laterally extending pin 42 in generally parallel alignment with a second pin 44 which is secured at one end to the shaft 24. A resilient, continuous loop, rubber band 46 is looped over the free ends of the rods 42 and 44 thereby providing a resiliently extensible connecting link. If a force is applied to the pivot arm 26 in a direction shown by the arrow 48, causing the pivot arm to rotate clockwise about the shaft 24, such action will cause pivoting of the shaft 44, transferring pivotal motion through the extensible link 46 to the rod 42, causing a corresponding clockwise pivotal motion of the base 34. As a result of such clockwise pivotal motion the inclined surface 36 will be displaced from left to right as shown in FIG. 4. The cylindrical element 38 will tend to remain stationary since it is held in place by the keeper spring 40. The element 38 will then become jammed between the surface 36 and the corresponding sweeper rod 12. Since the rod 12 is slidably supported in the bearing blocks 16 and 18, the sweeper will be displaced from left to right as shown in FIG. 4. The sweep portion 14 will be thereby urged along the corresponding track 10, impinging against and thereby advancing a serial array of small conductive chips 50. In this manner the chips 50 are advanced along the corresponding path 10 to the work station 8 shown in FIG. 1.

It is understood that for each track 10 and a corresponding sweep 12, a corresponding pivot arm 26 and jam clamp mechanism 32 are provided. FIG. 5 illustrates return motion of the base 34 counter clockwise about the shaft 24. Such motion is initiated upon release of a force applied to the link 30, which relaxes the tension applied to the extensible link 46. Upon relaxation of tension on the link 46 the base 34 is allowed to pivot slightly counter clockwise about the shaft 24 displacing the inclined surface 36 slightly from right to left as shown in FIG. 5. This motion releases the element 38 from compression against the corresponding sweep arm 12. In summary, as the base 34 pivots clockwise about the shaft 24 the corresponding sweep arm 12 is incrementally advanced from left to right as shown in FIG. 4. When the base 34 pivots counter clockwise the shaft 12 is released. Thus, upon pivotal reciprocation of the base 34 the corresponding shaft 12 will be intermittently advanced from left to right. FIGS. 4 and 5 illustrate a mechanical dog 52 in the form of a blade 54 tapered in the direction of movement of a corresponding shaft 12 from left to right. The blade 54 is mounted to a vertical block 56 mounted on the bearing block 18. A bolt 58 has a coil spring 60 mounted thereover. The spring resiliently biases the blade 54 in opposition to the direction of motion of a corresponding sweep shaft 12. When the shaft 12 is indexed or incrementally advanced from left to right, the coil spring is resiliently compressed upon pivoting of the blade 54 generally from left to right as shown in FIG. 4. When the jam clamp mechanism 32 releases a corresponding sweep shaft 12 as shown in FIG. 5, the blade 54 will impinge against the vertical block 56 and will tend to bite into the shaft 12 preventing motion of the shaft from right to left as shown in FIG. 5. More particularly, the shaft if tending to move from right to left will be pinched between the blade 54 and the bearing block 18. Yet when the shaft 12 tends to move from left to right the shaft will push against the blade 54 and collapse the resilient spring 60 to prevent pinching of the shaft and, more importantly, to allow motion of the shaft from left to right. As shown more particularly in FIGS. 1 and 6, the table 2 is provided with an overlying pivoting pressure platen shown generally at 62 and pivotally mounted on a shaft 63 carried by the table 2. The pressure platen 62 has a plurality of feet 64 which are spaced apart and interdigitated with the paths 10. A flexible circuit device 66 is positioned on the table surface 6 desirably at the work station 8. More particularly, chip receiving slitted portions of the circuitry 66 as disclosed in U.S. Pat. No. 4,024,627 are positioned at the work station in alignment with corresponding paths 10. The platen 62 holds the circuit device 66 in fixed position at the work station 8 while a foremost chip in each of the paths 10 is advanced by a sweeper 12 and thereby positioned for insertion into the slitted portions of the circuit device 66. As shown more particularly, in FIGS. 2, 3, and 6, the table 2 is provided with a vertically reciprocating ram 68 for each path 10 having a reduced tip 70 positioned directly below a foremost chip 50 in the path 10. Upon vertical upward movement of the ram, the ram tip 70 will engage the foremost chip 50 urging it vertically upward into insertion within a corresponding slitted portion of the circuit device 66, as shown more particularly in FIGS. 3 and 6.

The mechanism for actuating the ram 68 is shown more particularly in FIGS. 2, 3 taken in conjunction with FIG. 1. FIG. 1 illustrates a manual crank 72 for rotating a cam shaft 74. FIGS. 2 and 3 illustrate a cam 76 mounted on the cam shaft 74. Another shaft 78 is carried by fixed bearing arms 80 mounted under the table 2. The shaft 78 is parallel to the cam shaft 74 and carries pivotally thereon a second pivot arm 82 one end 84 of which engages against the lower end of the ram 68. The other end 86 of the pivot arm 82 engages the surface of the cam 76. The cam 76 includes a small projecting lobe 88 which is rotated to engage against the end 86 of the pivot arm 82 upon rotation of a hand crank 72. Thereby the pivot arm 82 is caused to rotate clockwise about the shaft 88 elevating the ram 68 from its position shown in FIG. 2 from its position shown in FIGS. 3 and 6. It is noted that a separate ram 68 is provided for each of the paths 10. Each separate ram 68 is provided with an accompanying pivot arm 82 and cam 76 mounted respectfully on the shafts 78 and 74.

Also as shown in FIGS. 2 and 3 another cam 90 is provided on the shaft 74. The cam 90 rotates with the cam 74 and is used to advance each sweep 84 immediately before each corresponding ram 68 is vertically actuated from its position shown in FIG. 2 to its position shown in FIG. 3. More specifically, the cam portion 91 is followed by the arm 30 causing clockwise pivotal motion of the pivot arm 26. This accounts for the application of force in the direction of the arrow 48 as shown in FIG. 4. Then the lobe 88 of the cam 76 will actuate the ram 68 followed by quick retraction of the ram 68, caused by expansion of a coil spring 92 which became compressed between the bottom of the table 2 and an enlarged collar 94 on the ram 68 during upward travel of the ram from its position shown in FIG. 2 to its position shown in FIG. 3.

Also as shown in FIGS. 2 and 3 is a third pivot arm 96 having one end 98 provided with a threadably adjustable projecting fastener 100 serving as a cam follower on the cylindrical surface of the cam 76. The other end of the pivot arm is indicated at 102 and, so long as the follower 100 is on the cylindrical periphery of the cam 76, the arm 102 engages one end 104 of a locating pin 106 mounted vertically through the table 2. The pivot arm thereby urges the pin 106 vertically upward to project through the surface 6 of the table 2 and through a corresponding locating aperture 108 provided through the flexible circuit 66. The pin abuts against a resilient pad 110 provided on the pressure arm 62. Upward displacement of the locating pin 106 resiliently compresses a coil spring 112 surrounding the pin and engaged against the bottom of the table 2 and against a collar 114 secured to the pin 106. As the cam 76 is rotated clockwise as shown in FIGS. 2 and 3, a recessed flat portion 116 of the cam will be rotated or pivoted into engagement by the follower 100. In so doing the third pivot arm 96 will be rotated counter clockwise about the shaft 78 allowing the coil spring 112 to expand and thereby displace the pin 106 vertically downward recessing the pin below the work surface 6. The pin thereby is removed from the locating aperture 108 of the flexible circuit 66 thereby releasing the circuit from its position on the work surface 6. What has been described is a complete cycle of operation of the insertion machine according to the present invention. When the follower 100 is engaged upon the flat surface 116 of the cam, some resistance to continued rotation is felt by an operator of the crank thereby providing a tactile feel signifying completion of a machine cycle of operation.

To repeat an operation an operator must first remove the pressure platen 62 from engagement with the circuit 66. This is done by lifting a pressure caster 67 from engagement on the platen 62. The platen can be pivoted away. The circuit can then be repositioned on the work surface 6 to locate additional slitted portions of the circuit at the work station for insertion and receipt of LED chips. The pressure platen 62 is then repositioned to retain the circuit in desired position. Rotation of the crank by an operator can then begin. Initial rotation will cause the follower 100 to ride up on the cylindrical periphery of the cam 76 providing an initial operation of projecting the locating pin 106 through a corresponding locating aperture in the circuit 66 whereby the pin 106 cooperates with the pressure platen 62 to position or to retain the circuitry in position at the work station. The pin will remain in this position shown in FIG. 2 so long as the cam follower 100 follows the cylindrical periphery of the cam 76. The pin is released only at the completion of a cycle of operation when the cam follower 100 once again returns to engage the cam surface 116.

Continued rotation of the cam shaft 74 by operation of the crank 72 will cause the pivot arm 26 to undergo clockwise pivotal motion about the shaft 24 activating the jam clamp mechanism 32 as described to advance the sweep along the paths 10 and urge foremost chips 50 in the tracks 10 into position over the corresponding rams 68. Continued rotation then causes each cam lobe 88 to engage a corresponding second pivot arm activating each ram 68 vertically upward to insert the foremost chips 50 into the slitted portions of the circuit 66 as shown in FIG. 6. Contained rotation of the cam 76 will cause each cam lobe 88 to pass by the pivot arm whereby the pivot arm will undergo counter clockwise rotation to retract each ram from a position shown in FIG. 3 to a position shown in FIG. 2. Upon completion of a full rotation of the cam 76 the cam follower 100 will once again register against the flat surface 116 retracting the locating pin 106.

In some cases it is desirable to enclose the chips 50 when supported in the grooves 10. Accordingly, FIGS. 4 and 5 illustrate a plastic film cover 118 overlying some of the chips 50 at a location remote from the depending portion 14 of the sweep. A block 120 overlies additional chips 50 and an edge margin of the film cover 118. The block has one or more integral depending feet 122 within corresponding grooves 10. The sweep then urges the block 120 as well as the chips 50 along the grooves 10. The chips will be urged along the grooves and under the cover 118 until positioned at the work station under the circuit device 66. The cover 118 is impinged against the circuit device 66 and is stationary while the block 120 and chips 50 are urged along the grooves 10.

What has been described and shown is a preferred embodiment of the present invention. Other embodiments and modifications which would be apparent to one having ordinary skill in the art are intended to be covered by the spirit and scope of the appended claims.

We claim:

1. An insertion device for small conductive chips, comprising:

a work table having a planar surface provided with a work station and a plurality of parallel vertically recessed paths communicating with said work station, a sweep in alignment with each said paths whereby chips serially aligned along said paths are urged by said sweep toward said work station, a pressure arm at said work station for horizontally pressing a substrate against said table, said pressure arm having a plurality of spaced feet engaging said substrate, said feet being interdigitated with said paths, an inserter ram mounted under said table for vertical reciprocation towards and away from said substrate at said work station, said inserter ram having a plurality of heads entering into respective tracks during reciprocation toward said substrate, a first pivot arm for urging said sweep along said path, jam clamp means connecting said first pivot arm and said sweep, a cam shaft having a first cam, a second pivot arm connected at one end with said cam and at another end to said inserter ram and said first pivot arm, and crank arm means for rotating said cam shaft whereby said cam is rotated pivoting said second pivot arm to vertically reciprocate said inserter ram for vertical insertion of a foremost chip of each said paths into a corresponding opening of said substrate, and whereby said inserter ram upon return vertical reciprocating motion pivots said first pivot arm to urge said sweep along said paths and thereby advance a serial array of chips along each said paths.

2. The structure as recited in claim 1 and further including:

means normally engaging said substrate to hold the same in position at said work station, said means engaging said cam and being actuated thereby to disengage from and thereby release said substrate upon completion of an insertion operation.

* * * * *